(12) United States Patent
Wu et al.

(10) Patent No.: US 6,413,832 B1
(45) Date of Patent: Jul. 2, 2002

(54) METHOD FOR FORMING INNER-CYLINDRICAL CAPACITOR WITHOUT TOP ELECTRODE MASK

(75) Inventors: King-Lung Wu, Tainan; Kun-Chi Lin, Hsin-Chu, both of (TW)

(73) Assignee: United Microelectronics Corp. (TW)

(*) Notice: Subject to any disclaimer, the term of this patent is extended or adjusted under 35 U.S.C. 154(b) by 0 days.

(21) Appl. No.: 09/755,105

(22) Filed: Jan. 8, 2001

(51) Int. Cl.[7] .................................................. H01L 21/20
(52) U.S. Cl. ........................................ 438/396; 438/253
(58) Field of Search ............................ 438/3, 240, 255, 438/253, 396, 398

(56) References Cited

U.S. PATENT DOCUMENTS

| | | | |
|---|---|---|---|
| 6,168,988 B1 * | 1/2001 | Schindler et al. | 438/253 |
| 6,174,770 B1 * | 1/2001 | Chi | 438/255 |
| 6,218,256 B1 * | 4/2001 | Agarwal | 438/393 |
| 6,284,551 B1 * | 9/2001 | Cho et al. | 438/3 |
| 6,284,595 B1 * | 9/2001 | Kato | 438/253 |

* cited by examiner

*Primary Examiner*—Tuan H. Nguyen

(57) ABSTRACT

A method for forming an inner-cylindrical capacitor without top electrode mask is disclosed. The method includes a step of a trench formed on the substrate. The trench structure with a conductive layer as a first lower electrode. The first poly spacer as second lower electrode of inner-cylindrical capacitor formed on sidewall of the trench, and furthermore a dielectric layer is formed by depositing on sidewall of first poly spacer and a floor of the cylindrical trench. Then, the second poly spacer formed on sidewall of dielectric layer. The poly plug is formed by depositing polysilicon layer and polished by chemical mechanical polishing (CMP) process. Thus, an inner-cylindrical capacitor is generated.

22 Claims, 3 Drawing Sheets

METHOD FOR FORMING INNER-CYLINDRICAL CAPACITOR WITHOUT TOP ELECTRODE MASK

BACKGROUND OF THE INVENTION

1. Field of the Invention

The present invention generally relates to a method for forming a dynamic random access memory (DRAM), and more particularly to a method for fabricating an inner-cylindrical capacitor in DRAM.

2. Description of the Prior Art

Modern semiconductor for fabricating technique in an ultra large scale integration (ULSI) highly increases the circuit density on a chip. The increase of circuit density causes the downsizing of devices and the increase of device packing density.

Although commonly referred to as semiconductor devices, the devices are fabricated from various materials, including conductors (e.g., aluminum, tungsten), non-conductors (e.g., silicon dioxide) and semiconductors (e.g., silicon). Silicon is the most commonly used semiconductor, and is used in either its single crystal or polycrystalline form. Polycrystalline silicon is often referred to the silicon is adjusted by adding impurities.

The integrated circuit devices with their various conductive layers, semiconductor layers, insulating layers, contacts and interconnects are formed by fabrication processes, including doping processes, deposition processes, photolithorgraphy processes, etching processes and other processes.

Demand of dynamic random access memory (DRAM) has rapidly increased owing to widespread use of integrated circuits. Each cell of DRAM includes transistors and a capacitor, which is used for the purpose of charge storage. As DRAM becomes highly integrated, the area occupied by the capacitor of DRAM storage cell shrinks, thus decreasing the capacitance of the capacitor owing to its smaller electrode surface area. In order to reduce the cell dimension and yet obtain a high capacitance, the cylindrical-shaped capacitor, which includes an inner surface in addition to an outer surface, was disclosed to increase the surface area of the capacitor electrode.

DRAM is a device broadly used in electronic industry for data storage due to the characteristic of increased circuit density in an integrated circuit (IC). This stored information or message is determined by the charges stored in an internal capacitor of a memory cell. The access of data is performed by operating the read/write circuit and the peripheral memory in a chip. A single DRAM cell comprises a field effect transistor (FET) and a capacitor as a bit for representing a binary data.

The basic DRAM cell is usually comprised of a transfer gate transistor and a connected capacitor. Charges are stored in the capacitor section of DRAM, and are accessed via the transfer gate transistor. The ability to densely pack storage cells, while still maintaining sufficient stored charge, is a function of the type and structure of the capacitor section of DRAM. Two iterations of capacitors are presently being manufactured. A trench capacitor, in which charge is stored vertically in a structure fabricated by etching a deep trench in a substrate, has found use where high DRAM densities are desired. This type of capacitor, although eventually needed for the higher density DRAM, is however costly to fabricate, regarding the trench etching, trench filling and planarization processing. The advantage of trench capacitor is that the device surface is much more plane after the capacitors finished. Moreover, the processes for dielectric materials used therein, such as nitride or oxidate nitride, have been well developed. However, it requires deep trenches to provide sufficient capacitance, which increases the difficulties of etching and trench filling. Trench capacitors take another advantage of the vertical space available in a semiconductor substrate material, thus reducing the overall layout size of a semiconductor device on the substrate surface.

The disadvantages often associated with such structures are the complexity and number of the process steps required in fabrication. For example, in order to utilize vertical space, trenches for forming capacitors should be fabricated deeper. To form deeper trenches, we need more than one step for forming trench. Furthermore, as the trench is formed deeper the trench also becomes narrower, resulting in manufacturing difficulties during subsequent processing. Another disadvantage with a deep, narrow trench is that the effective capacitance of the cell is required to below a desirable amount.

A second type of capacitor used in DRAM technology is stacked capacitor cell. In this design two conductive layers, such as polycrystalline silicon, are placed over a section of the transfer gate transistor, with a dielectric layer sandwiched between the polycrystalline layers. The stacked capacitor iteration has been used extensively in the industry, with emphasis placed on reducing the cost, while still increasing DRAM chip densities.

One ongoing goal of semiconductor design and fabrication is to reduce costs. Cost reduction is essential to ongoing success in the field. One manner of reducing costs is to eliminate or optimize steps in the semiconductor fabrication process such as without top electrode mask for forming inner-cylindrical capacitor. In doing so, it is important to maintain or improve device and process efficiency and effectiveness.

SUMMARY OF THE INVENTION

In accordance with the present invention, a method is provided that top electrode mask of inner-cylindrical capacitor can be omitted.

It is an object of this invention that substantially can reduce the cost for fabricating inner-cylindrical capacitor.

To achieve these objects and advantages, and in accordance with the purpose of the invention, as embodied and broadly described herein, the invention directed toward a method for fabricating a capacitor is proposed. An etch-stop layer and an etch-buffer layer are formed sequentially on the substrate. Then, a first photoresist layer is defined on the etch-buffer layer to form a bit line. After the first photoresist layer is removed, a silicon dioxide layer, a first conductive layer, and an insulating layer are formed sequentially on the substrate, wherein the first conductive layer is a first lower electrode of the inner-cylindrical capacitor. Then, a silicon dioxide layer, a first conductivity layer, and an insulating layer are etched sequentially and then etched stop on the etch-buffer layer. Next, an etch-buffer layer is etched stop on the etch-stop layer. Therefore, a trench structure is formed on the substrate. Then, a first polysilicon spacer, as a second lower electrode, is formed on the floor and sidewall of the trench. Then, a thin dielectric layer is deposited on the sidewall of the first polysilicon spacer. The dielectric layer consists of silicon nitride and an oxide layer. Next, a second polysilicon spacer is formed on the sidewall of the dielectric layer. Then, a polysilicon layer is filled within the trench structure and excess polysilicon layer is removed by chemical mechanical polishing (CMP). Then, a polysilicon plug as a top electrode is formed in the trench.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
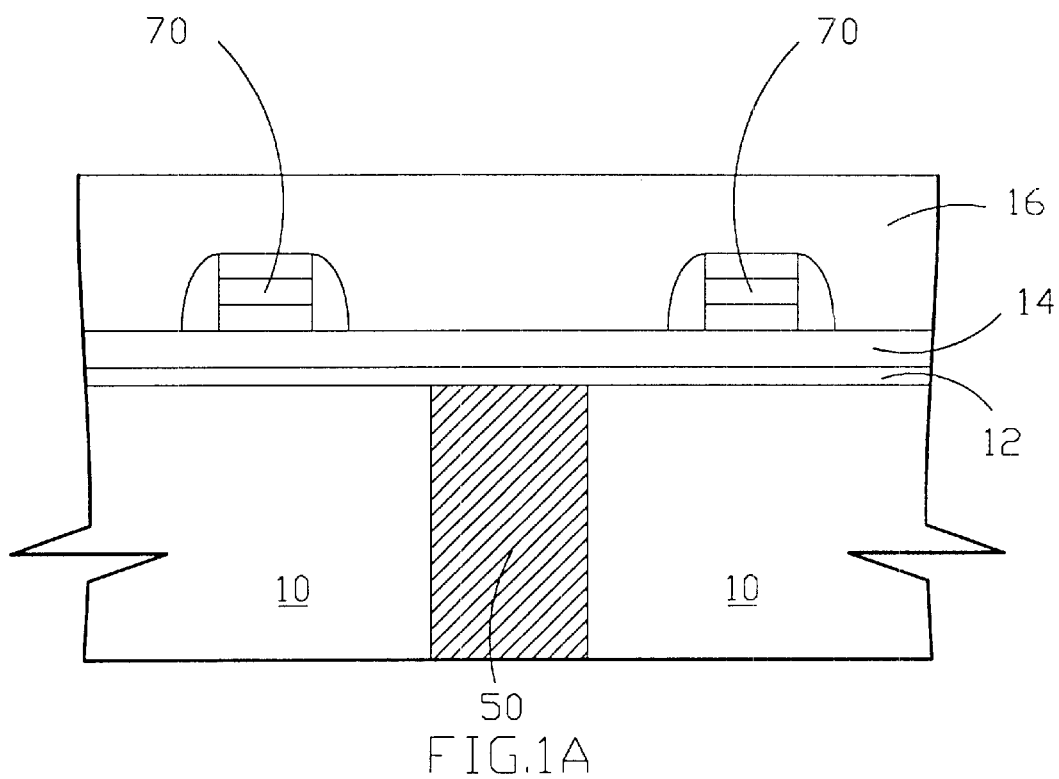
FIG. 1A is a cross-sectional view of a semiconductor device having a bit structure on substrate and a plug in the substrate.
Figure 1B:
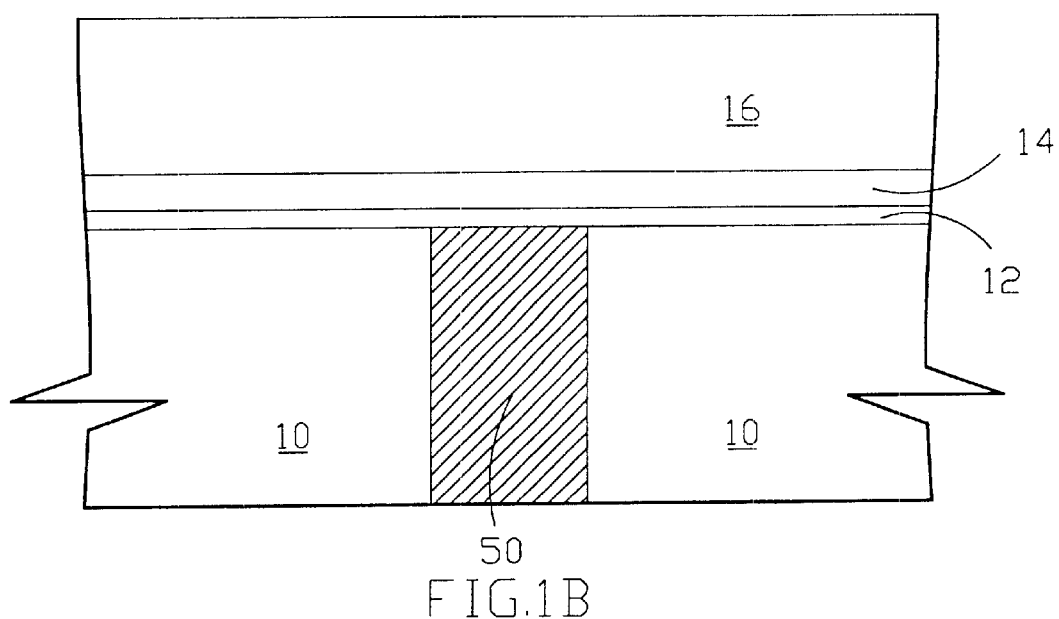
FIG. 1B is a cross-sectional view of a semiconductor device formed on substrate.

Referring to FIGS. 1A and 1B, a substrate 10 with a plug 50 is provided. A silicon nitride layer 12 as an etch-stop layer is formed on a semiconductor substrate 10 with thickness about 160 angstroms. A silicon dioxide layer 14 is then deposited on etch-stop layer 12 to serve as an etch-buffer layer with thickness about 2000 angstroms by using a conventional low pressure chemical vapor deposition (LPCVD) or plasma enhanced chemical vapor deposition (PECVD) method. A first photoresist layer is defined on etch-buffer layer 14 to form bit line 70 (shown in the FIG. 1A). The bit line 70 is the structure similar to the gate electrode. The first photoresist layer is removed after the bit line 70 formed on etch-buffer layer 14.

Figure 2:
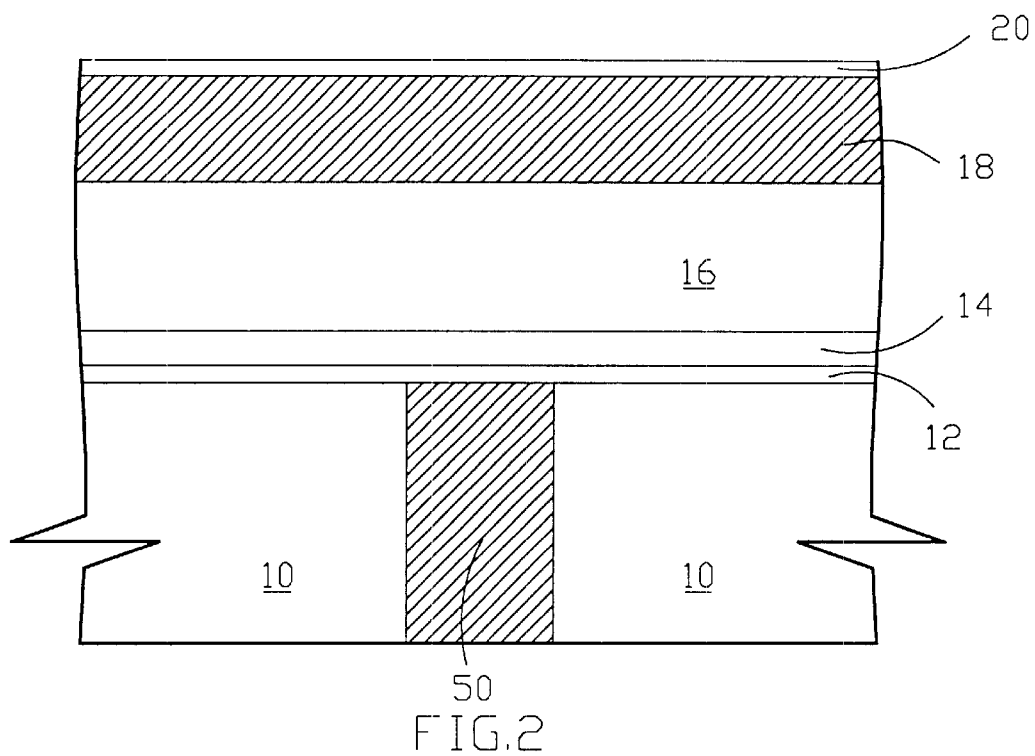
FIG. 2 shows a cross-sectional view of a semiconductor device having a conductive layer formed on substrate.

Referring to FIG. 2, a silicon dioxide layer 16 is deposited on the etch-buffer layer 14 by conventional chemical vapor deposition with thickness about 10000 angstroms. Then, a polysilicon layer 18 as a first conductive layer is deposited on silicon dioxide layer 16 by conventional chemical vapor deposition method with thickness about 4000 angstroms, wherein an polysilicon layer 18 is first lower electrode for inner-cylindrical capacitor. A tetraethyl orthosilicate layer (TEOS) 20 as an insulating layer is deposited cover the surface of the first conductive layer 18 by LPCVD with thickness about 100 angstroms. This is an optional step for this invention.

Figure 3:
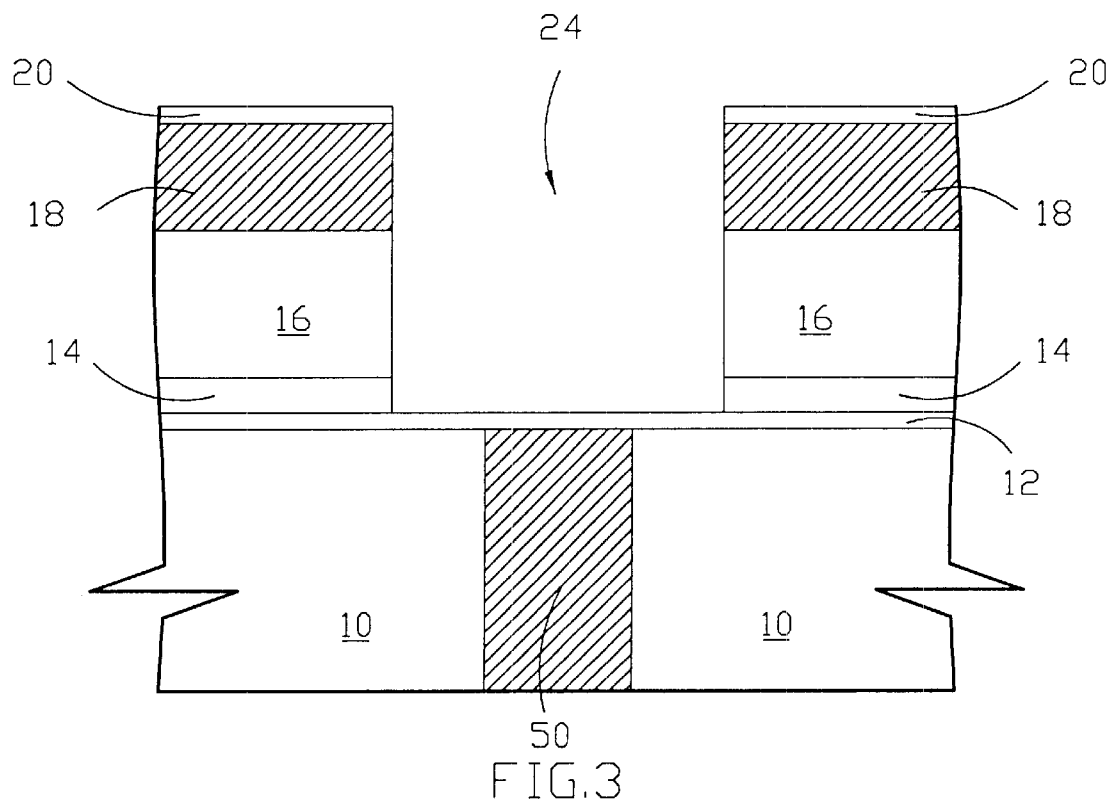
FIG. 3 shows a cross-sectional view illustrates of the trench structure on the substrate.
Figure 4:
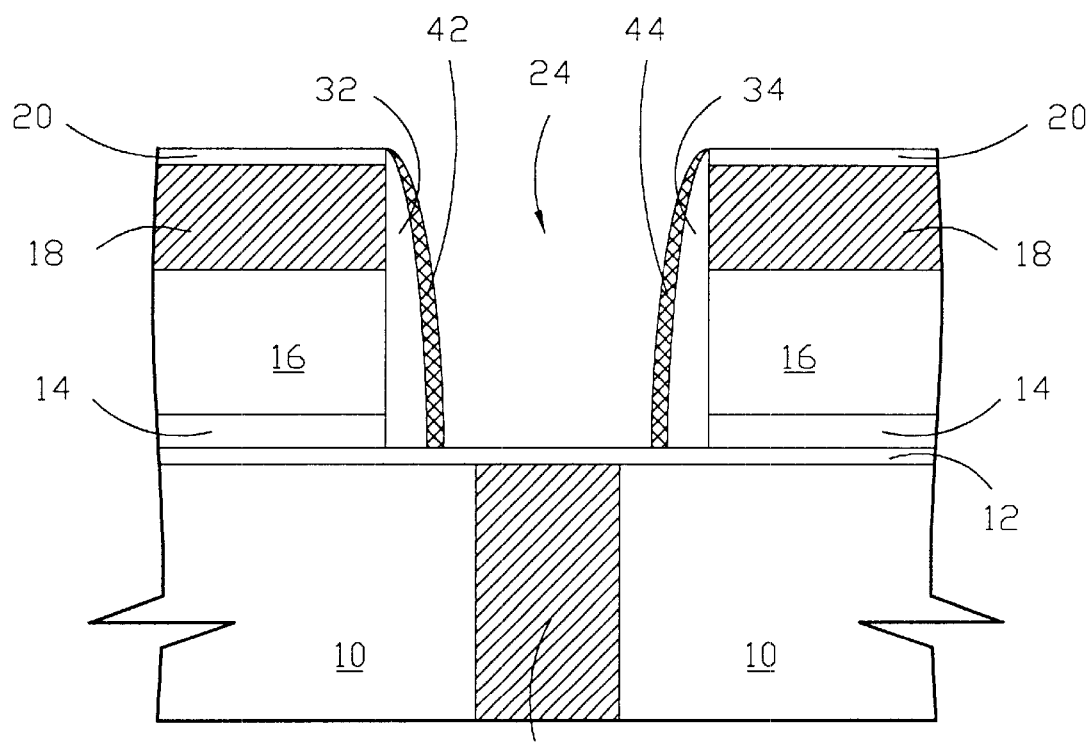
FIG. 4 shows a cross-sectional view that first poly spacer formed on the sidewall of the trench and a dielectric layer formed in the trench.

Referring to FIG. 3, a second photoresist layer is formed on the insulating layer 20. Next, a pattern is patterned on the insulating layer 20 using conventional photolithographic techniques. Then, a second photoresist layer is used as a mask. Next, an insulating layer 20 and first conductive layer 18 are etched subsequently and etched stop on the etch-buffer layer 14. Then, etch-buffer layer 14 is etched stop on etch stop layer 12, thereafter an insulating layer 20 is removed, thereby a trench 24 is formed on the substrate 10. Referring to FIG. 4, a first polysilicon spacer 32, 34 as a second lower electrode of an inner-cylindrical capacitor is formed on the sidewall of the trench 24 by depositing a polysilicon layer over the trench 24 and using anisotropic dry etching to stop etch on the etch-stop layer 12. Then, a dielectric layer 42, 44 is formed on the sidewall of the first polysilicon spacer 32, 34 by depositing dielectric layer over the trench 24 and using dry etch to stop etch on etch-stop layer 12, wherein the dielectric layer is constructed by silicon oxide/silicon nitride/silicon oxide material and a silicon oxide layer with a thickness of about 100 angstroms and a silicon nitride layer with a thickness of about 53 angstroms. In a conventional oxide dielectric layer, there are alot of defects, such as pin holes, by which charges can get loose. Generally, the nitride layer which has a dense structure is formed as a barrier layer to prevent such charges.

Figure 5:
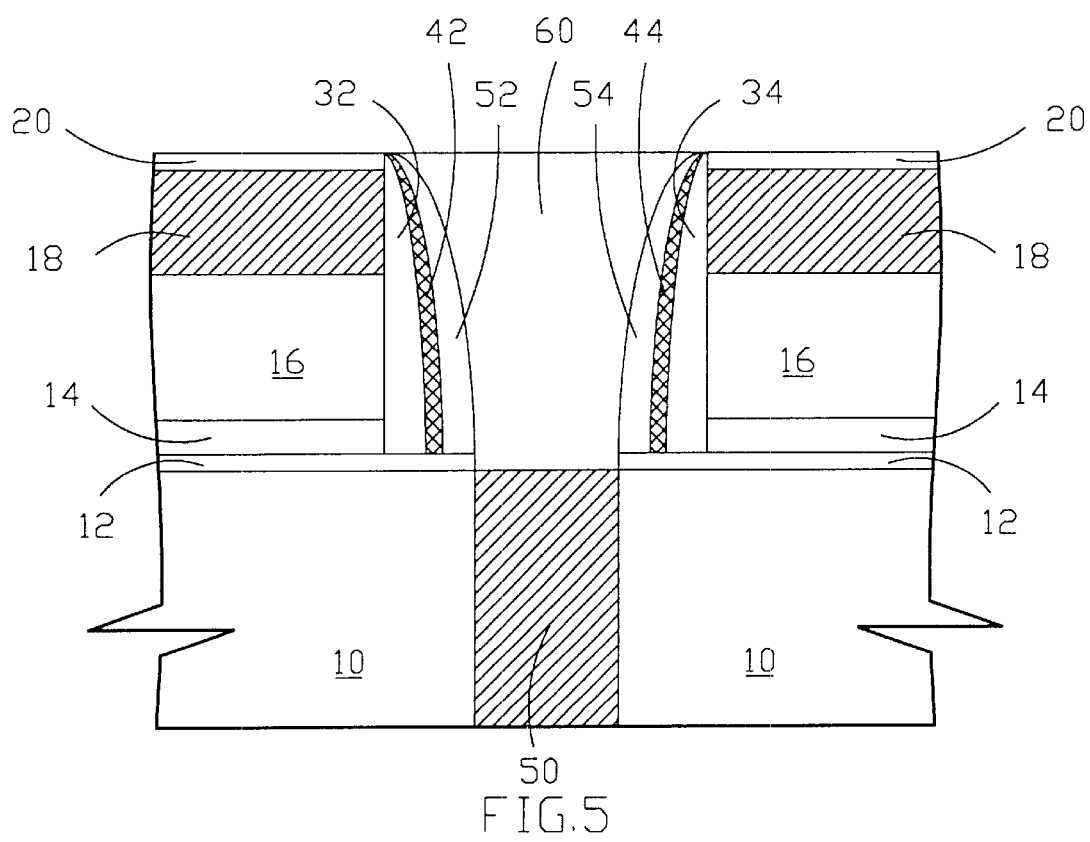
FIG. 5 shows a cross-sectional view for an inner-cylindrical capacitor.

Referring to FIG. 5, a second polysilicon spacer 52, 54 is formed on sidewalls of the dielectric layer 42, 44 by depositing a polysilicon layer and etched back by using anisotropic dry etching process throught the etch-stop layer 12 extended to the polysilicon plug 50 in the substrate 10. Then, a polysilicon plug 50 as a top electrode 60 of inner-cylindrical capacitor is formed by depositing polysilicon layer into the trench 24 and removing excess the polysilicon layer by means of a conventional planarization process such as chemical mechanical polishing (CMP) process.

According to the present invention, the top electrode mask for fabricating the inner-cylindrical capacitor in DRAM is omitted. So, the process can be simplified and the cost of fabricating capacitor can be reduced.

Although specific embodiments have been illustrated and described, it will be obvious to those skilled in the art that various modifications may be made without departing from what is intended to be limited solely by the appended claims.

What is claimed is:

1. A method for forming a capacitor, said method comprising steps of:

providing a substrate;

forming a cylindrical trench in said substrate;

forming a first spacer on sidewall of said trench;

forming a conformal dielectric layer on sidewall of said first spacer;

forming a second spacer on sidewall of said conformal dielectric layer; and forming a plug in said trench.

2. The method according to claim 1, wherein a material of said first spacer is polysilicon.

3. The method according to claim 1, wherein said dielectric layer comprises a silicon oxide/silicon nitride/silicon oxide layer.

4. The method according to claim 1, wherein a material of said second spacer is polysilicon.

5. The method according to claim 1, wherein said step of forming said plug comprises depositing a polysilicon layer into said trench and removing excess said polysilicon layer.

6. A method for fabricating an inner-cylindrical capacitor in dynamic random access memory, said method comprising steps of:

providing a semiconductor structure having a substrate, a plug in said substrate, an etch-stop layer is formed on said substrate and on said plug, an etch-buffer layer is formed on said etch-stop layer, a bit line structure is formed on said etch-buffer layer, a planarized silicon dioxide layer is formed on said etch-buffer layer and on said bit line structure, and a first conductive layer is formed on said silicon dioxide layer;

forming a cylindrical trench in said first conductive layer, said silicon dioxide layer, said etch-buffer layer over said etch-stop layer;

depositing a first spacer on sidewall of said trench;

depositing a conformal dielectric layer on said first spacer;

depositing a second spacer on sidewall of said conformal dielectric layer; and forming a plug in said trench.

7. The method according to claim 6, wherein a material of said etch-stop layer is silicon nitride.

8. The method according to claim 6, wherein a material of said etch-buffer layer is silicon dioxide.

9. The method according to claim 6, wherein a material of said first conductive layer is polysilicon.

10. The method according to claim 6, wherein a material of said first spacer is polysilicon.

11. The method according to claim 6, wherein a material of said second spacer is polysilicon.

12. The method according to claim 6, wherein a material of said plug is polysilicon.

13. The method according to claim 6, wherein said step of forming said plug comprises depositing a polysilicon layer into said trench and removing excess said polysilicon layer.

14. A method for fabricating an inner-cylindrical capacitor in dynamic random access memory, said method comprising steps of:

providing a semiconductor structure having a substrate, a plug in said substrate, an etch-stop layer is deposited on said substrate and on said plug, an etch-buffer layer is deposited on said etch-stop layer, a bit line structure is formed on said etch-buffer layer, a planarized silicon dioxide layer is formed on said etch-buffer layer and on said bit line structure, an insulating layer is deposited on said silicon dioxide layer, and a first conductive layer is formed on said silicon dioxide layer;

forming an inner-cylindrical trench in said insulating layer, said first conductive layer, said silicon dioxide layer, said etch-buffer layer, wherein said insulating layer, said first conductive layer, and said silicon dioxide layer are sequentially over said etch-stop layer;

depositing a first spacer on said sidewall of said inner-cylindrical trench;

depositing a dielectric layer over said first spacer and over a bottom of said inner-cylindrical trench;

depositing a second spacer on sidewall of said dielectric layer; and forming a plug in said inner-cylindrical trench.

15. The method according to claim 14, wherein a material of said etch-stop layer is silicon nitride.

16. The method according to claim 14, wherein a material 0of said etch-buffer layer is silicon dioxide.

17. The method according to claim 14, wherein a material of said first conductive layer is polysilicon.

18. The method according to claim 14, wherein a material of said insulating layer is tetraethyl orthosilicate.

19. The method according to claim 14, wherein said dielectric layer comprises a silicon dioxide/silicon nitride/silicon dioxide layer.

20. The method according to claim 14, wherein a material of said plug is polysilicon.

21. The method according to claim 14, wherein said step of forming said plug comprises depositing a polysilicon layer into said trench and removing excess said polysilicon layer.

22. The method according to claim 14, wherein a material of said excess polysilicon removed is by chemical mechanical polishing.

* * * * *